(12) United States Patent
Hsu

(10) Patent No.: US 9,354,261 B2
(45) Date of Patent: May 31, 2016

(54) DUTY CYCLE DETECTING CIRCUIT FOR PULSE WIDTH MODULATION

(71) Applicant: dadny Inc., Taipei (TW)

(72) Inventor: Lu-Yueh Hsu, Sinjhuang (TW)

(73) Assignee: Priceplay Taiwan Inc., Taipei (TW)

( * ) Notice: Subject to any disclaimer, the term of this patent is extended or adjusted under 35 U.S.C. 154(b) by 0 days.

(21) Appl. No.: 14/101,641

(22) Filed: Dec. 10, 2013

(65) Prior Publication Data

US 2014/0097825 A1  Apr. 10, 2014

Related U.S. Application Data

(62) Division of application No. 11/987,685, filed on Dec. 4, 2007, now abandoned.

(51) Int. Cl.
   *G01R 23/02* (2006.01)
   *G01R 29/027* (2006.01)

(52) U.S. Cl.
   CPC ............ *G01R 23/02* (2013.01); *G01R 29/0273* (2013.01)

(58) Field of Classification Search
   CPC .............................. G01R 23/02; G01R 29/0273
   USPC ........................................................ 324/76.15
   See application file for complete search history.

(56) References Cited

U.S. PATENT DOCUMENTS

2006/0127066 A1*  6/2006  Chiu ..................... F04D 27/004
                                                                388/804

OTHER PUBLICATIONS

Marshall, Dave, Nyquist Sampling Theorem, http://www.cs.cf.ac.uk/Dave/Multimedia/node149.html.*
RobotRoom, Noisy Duty Cycle, Measurement of a Variable Frequency Duty Cycle, p. 1-2, http://www.robotroom.com/PNA4602M-Replacement-5.html , Dec. 27, 2015.*

* cited by examiner

*Primary Examiner* — Thomas F Valone
(74) *Attorney, Agent, or Firm* — Wang Law Firm, Inc.

(57) ABSTRACT

A duty cycle detecting circuit for pulse width modulation (PWM). The circuit includes a clock generating circuit, a sampling circuit and a calculation circuit. The clock generating circuit is for generating a clock signal. The sampling circuit receives a PWM signal and the clock signal, samples the PWM signal based on the clock signal, and generates a sampling signal. The calculation circuit is for calculating the duty cycle of the PWM signal based on the sampling signal.

12 Claims, 4 Drawing Sheets

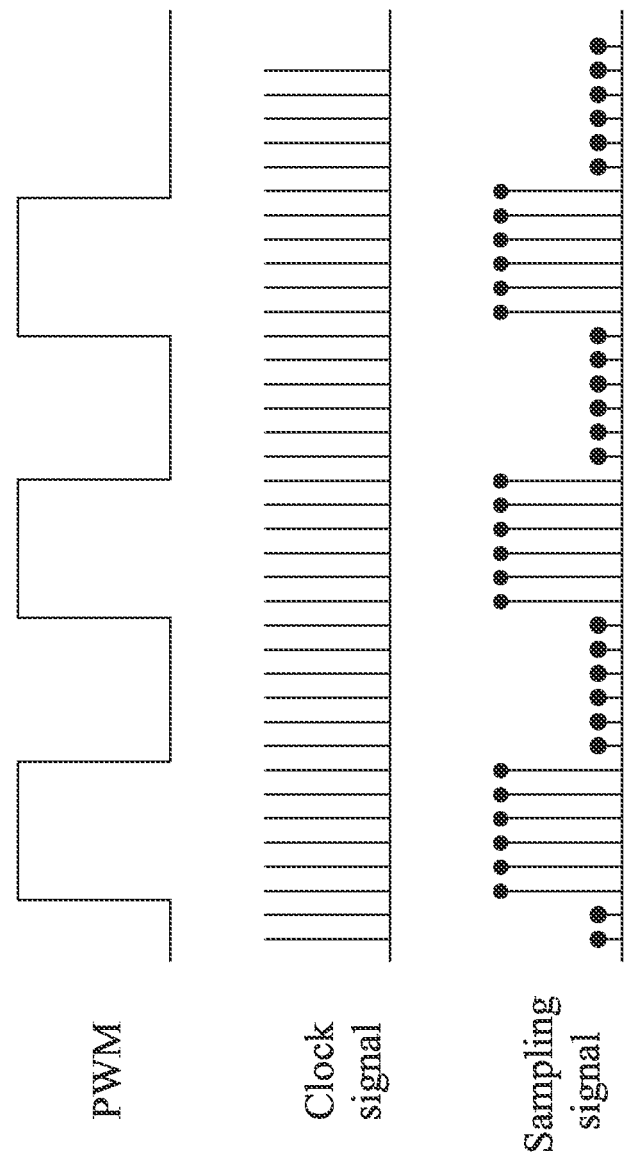

DUTY CYCLE DETECTING CIRCUIT FOR PULSE WIDTH MODULATION

CROSS-REFERENCE TO RELATED APPLICATION

This application is a divisional of U.S. patent application Ser. No. 11/987,685, filed Dec. 4, 2007, which is incorporated by reference herein in its entirety and for all purposes.

BACKGROUND OF THE INVENTION

1. Field of the Invention

The present invention relates to a duty cycle detecting circuit for pulse width modulation (PWM), and more particularly to a detecting circuit that samples a PWM signal based on a clock frequency and calculates the duty cycle of the pulse width modulation signal based on the sampling results.

2. Description of the Related Art

Pulse Width Modulation (PWM) has been used extensively in electronic circuits including motor control circuits and power supply devices. In general, a pulse signal with a fixed frequency is used for controlling the ON and OFF states of a transistor. In a pulse width modulation system, a change of pulse width is used for determining the time interval of being active or cut-off for the transistor to achieve the control effect. In other words, the duty cycle of the PWM signal indicates a proportion of the active time (or high electric potential) of the pulse signal and plays an important role in the pulse width modulation system.

However, the duty cycle is very sensitive to many factors including an operating frequency, an operating temperature, a power voltage, and a circuit design. Therefore, it is an important subject to detect an actual duty cycle of a pulse signal in a pulse width modulation system under different operating conditions.

SUMMARY OF THE INVENTION

To achieve the foregoing objective, the present invention provides a duty cycle detecting circuit for pulse width modulation that is applied for detecting a duty cycle of a PWM signal, and the duty cycle detecting circuit comprises: a clock generating circuit for generating a clock signal; a sampling circuit, in communication with the clock generating circuit without any intermediate component, for receiving the PWM signal and the clock signal and sampling the PWM signal based on the clock signal to generate a sampling signal; and a calculation circuit, in communication with the sampling circuit and the clock generating circuit without any intermediate component, for calculating the duty cycle of the PWM signal based on the sampling signal.

In the duty cycle detecting circuit for pulse width modulation, the sampling signal includes a high electric potential state and a low electric potential state. The calculation circuit accumulates signal samples in high electric potential states and total signal samples to obtain a number of signal samples in high electric potential states and a total number of signal samples respectively, and divides the number of signal samples in high electric potential states by the total number signal samples to obtain the duty cycle.

In the duty cycle detecting circuit for pulse width modulation, the calculation circuit accumulates signal samples in high electric potential states and signal samples in low electric potential states to obtain a number of signal samples in high electric potential states and a number of signal samples in low electric potential states respectively, and divides the number of signal samples in high electric potential states by the sum of the number of signal samples in high electric potential states and the number of signal samples in low electric potential states to obtain the duty cycle.

In the duty cycle detecting circuit for pulse width modulation, the clock generating circuit is an oscillator, and the sampling circuit is a flip-flop. The calculation circuit comprises a microprocessor unit for processing an operation required for calculating the duty cycle, and a memory unit for storing a computer code required for calculating the duty cycle.

In the duty cycle detecting circuit for pulse width modulation, the calculation circuit further comprises a counter for receiving the sampling signal, and accumulating signal samples in high electric potential states and signal samples in low electric potential states to obtain a number of signal samples in high electric potential states and a number of signal samples in low electric potential states respectively. The calculation circuit further includes a division circuit for dividing the number of signal samples in high electric potential states by the sum of the number of signal samples in high electric potential states and the number of signal samples in low electric potential states to obtain the duty cycle. The calculation circuit further includes a reset circuit for resetting the counter after a predetermined number of signal samples, so that the counter restarts accumulating signal samples in high electric potential states and signal samples in low electric potential states again.

In the duty cycle detecting circuit for pulse width modulation, the calculation circuit includes a counter for receiving the sampling signal, and accumulating signal samples in high electric potential states and total signal samples to obtain a number of signal samples in high electric potential states and a total number of signal samples respectively. The calculation circuit further includes a division circuit for dividing the number of signal samples in high electric potential states by the total number of signal samples. The calculation circuit further includes a reset circuit for resetting the counter after a predetermined number of signal samples, so that the counter restarts accumulating signal samples in high electric potential states and signal samples in low electric potential states again.

BRIEF DESCRIPTION OF THE DRAWINGS

FIG. 4 illustrates a relation of a PWM signal, a clock signal and a sampling signal in accordance with the present invention.

DETAILED DESCRIPTION OF THE PREFERRED EMBODIMENTS

To make it easier for our examiner to understand the objective of the invention, its structure, innovative features, and performance, we use preferred embodiments together with the attached drawings for the detailed description of the invention.

Figure 1:
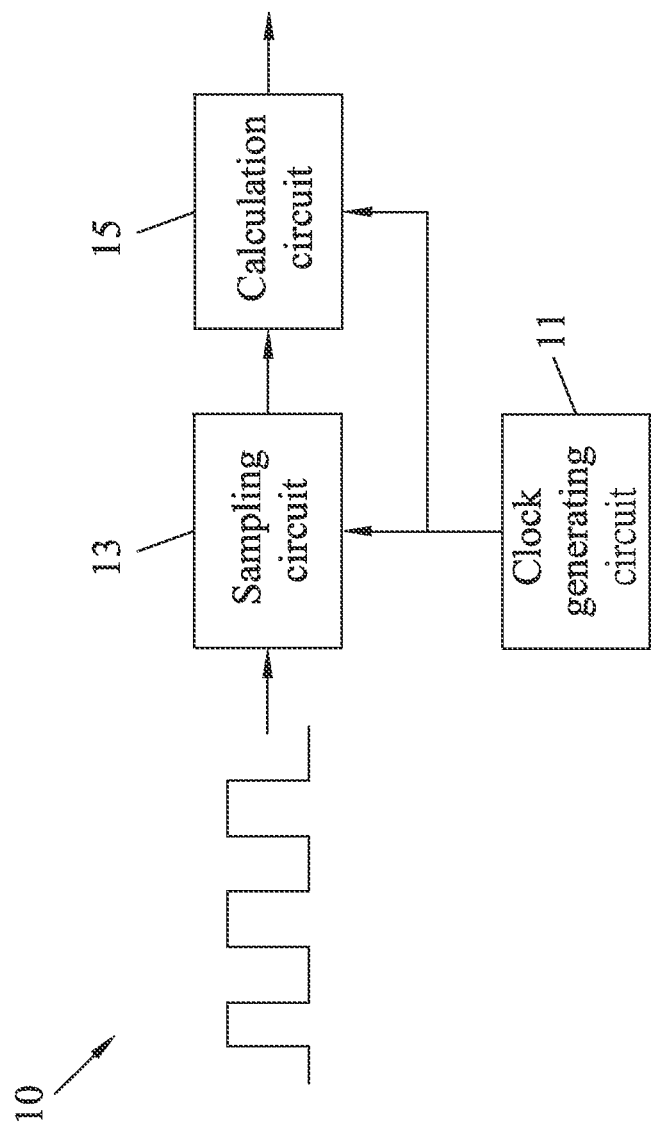
FIG. 1 illustrates a block diagram of a duty cycle detecting circuit for pulse width modulation in accordance with the present invention.

Referring to FIG. 1 for a block diagram 10 of a duty cycle detecting circuit for pulse width modulation in accordance with the present invention, the duty cycle detecting circuit is applied for detecting a duty cycle of a PWM signal, and the duty cycle detecting circuit comprises: a clock generating circuit 11 for generating a clock signal; a sampling circuit 13 for receiving the PWM signal and the clock signal, and sampling the PWM signal based on the clock signal to generate a sampling signal; and a calculation circuit 15 for calculating the duty cycle of the PWM signal based on the sampling signal. The higher the frequency of the clock signal, the higher is the sampling frequency. The higher the sampling frequency, the higher is the accuracy of the detecting result. The frequency of a clock signal can be selected based on the frequency of the PWM signal. For example, a clock equals to ten times of the frequency of the pulse width modulation signal as the frequency of the clock signal.

In the duty cycle detecting circuit for pulse width modulation as shown in FIG. 4, the sampling signal includes a high electric potential state and a low electric potential state. In a preferred embodiment, the calculation circuit accumulates signal samples in high electric potential states and total signal samples to obtain a number of signal samples in high electric potential states and a total number of signal samples respectively and divides the number of signal samples in high electric potential states by the total number of signal samples to obtain the duty cycle.

In the duty cycle detecting circuit for pulse width modulation in accordance with another preferred embodiment, the calculation circuit accumulates signal samples in high electric potential states and signal samples in low electric potential states to obtain a number of signal samples in high electric potential states and a number of signal samples in low electric potential states respectively, and dividing the number of signal samples in high electric potential states by the sum of the number of signal samples in high electric potential states and the number of signal samples in low electric potential states to obtain the duty cycle. When the sampling is performed, the cycle of a single PWM signal is used as a unit time for the sampling to obtain the duty cycle of the single PWM signal; or the cycle of several PWM signals is used as a unit time for the sampling to obtain an average duty cycle.

Figure 2:
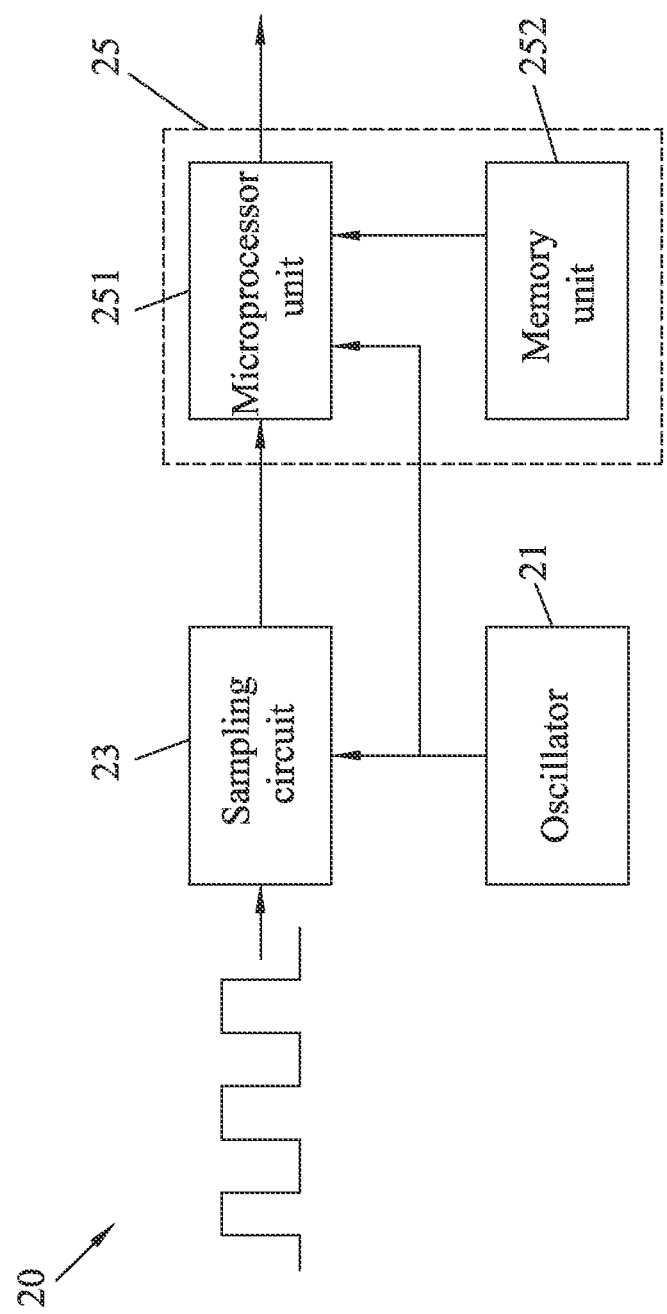
FIG. 2 illustrates a duty cycle detecting circuit for pulse width modulation in accordance with a first preferred embodiment of the present invention.

Referring to FIG. 2 for a duty cycle detecting circuit for pulse width modulation in accordance with a first preferred embodiment 20, the clock generating circuit is an oscillator 21; the calculation circuit 25 comprises a microprocessor unit 251, for processing the operation required for calculating the duty cycle; and a memory unit 252, for storing a computer code required for calculating the duty cycle. The computer code drives the microprocessor unit 251 to accumulate signal samples in high electric potential states and total signal samples to obtain a number of signal samples in high electric potential states and a total number of signal samples respectively, and dividing the number of signal samples in high electric potential states by the total number of signal samples to obtain the duty cycle, or accumulating signal samples in high electric potential states and signal samples in low electric potential states to obtain a number of signal samples in high electric potential states and a number of signal samples in low electric potential states respectively, and dividing the number of signal samples in high electric potential states by the sum of the number of signal samples in high electric potential states and the number of signal samples in low electric potential states to obtain the duty cycle. When the sampling is performed, the cycle of the single PWM signal is used as a unit time for the sampling to obtain the duty cycle of the single PWM signal; or the cycle of several PWM signals is used as a unit time for the sample to obtain an average duty cycle.

Figure 3:
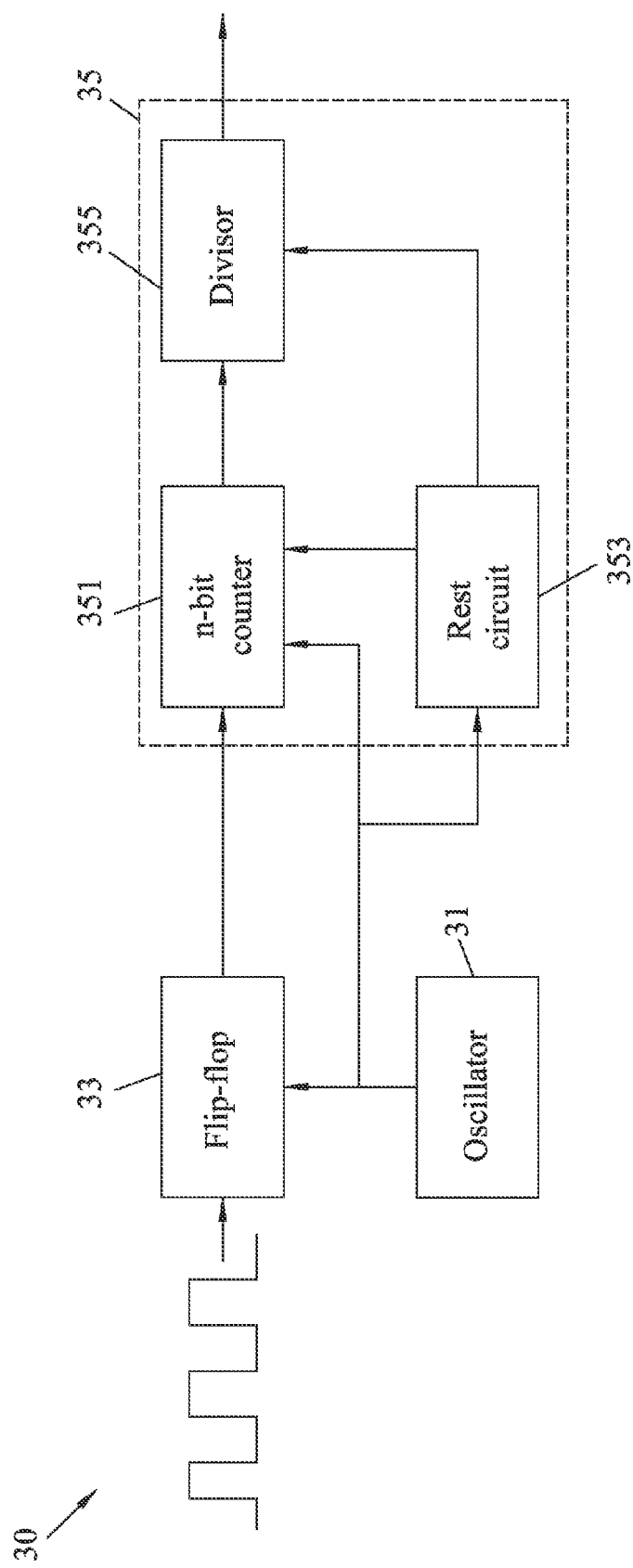
FIG. 3 illustrates a duty cycle detecting circuit for pulse width modulation in accordance with a second preferred embodiment of the present invention.

Referring to FIG. 3 for a duty cycle detecting circuit for pulse width modulation in accordance with a second preferred embodiment 30, the clock generating circuit is an oscillator 31; the sampling circuit is an flip-flop 33; and the calculation circuit 35 comprises a counter 351 for receiving the sampling signal, and accumulating signal samples in high electric potential states and signal samples in low electric potential states to obtain a number of signal samples in high electric potential states and a number of signal samples in low electric potential states respectively. The calculation circuit 35 further includes a divider 355 for dividing the number of signal samples in high electric potential states by the sum of the number of signal samples in high electric potential states and the number of signal samples in low electric potential states to obtain the duty cycle. The calculation circuit 35 further includes a reset circuit 353 for resetting the counter 351 after a predetermined number of signal samples, so that the counter 351 starts accumulating signal samples in high electric potential states and signal samples in low electric potential states again.

In a duty cycle detecting circuit for pulse width modulation in accordance with a second embodiment, the counter 351 accumulates signal samples in high electric potential states and total signal samples to obtain a number of signal samples in high electric potential states and a total number of signal samples respectively. The divider 355 divides the number of signal samples in high electric potential states by the total number of signal samples to obtain the duty cycle.

While the duty cycle detecting circuit for pulse width modulation in accordance with the invention has been described by means of specific embodiments, numerous modifications and variations could be made thereto by those skilled in the art without departing from the scope and spirit of the invention set forth in the claims.

What is claimed is:

1. A duty cycle detecting circuit for pulse width modulation, applied for detecting a duty cycle of a PWM signal, comprising:

a clock generating circuit arranged for generating a clock signal;

a sampling circuit, in communication with the clock generating circuit without any intermediate component, arranged for receiving the PWM signal and the clock signal, sampling the PWM signal based on the clock signal, and generating a sampling signal; and a calculation circuit, in communication with the sampling circuit and the clock generating circuit without any intermediate component, arranged for calculating a frequency and the duty cycle of the PWM signal based on the sampling signal in a predetermined time period and adjusting a frequency of the clock signal by controlling the clock generating circuit according to the PWM signal frequency;

wherein the frequency of the clock signal is selected based on the frequency of the PWM signal such that the frequency of the clock signal equals to at least ten times of the frequency of the PWM signal;

wherein the sampling signal comprises a high electric potential state and a low electric potential state;

wherein the calculation circuit accumulates signal samples in high electric potential states and total signal samples respectively;

wherein the calculation circuit divides a number of signal samples in high electric potential states by a total number of signal samples to obtain the duty cycle.

2. The duty cycle detecting circuit for pulse width modulation of claim 1, wherein the clock generating circuit is an oscillator.

3. The duty cycle detecting circuit for pulse width modulation of claim 1, wherein the calculation circuit comprises:
   a microprocessor unit for processing an operation required to calculate the duty cycle; and
   a memory unit for storing a computer code required to calculate the duty cycle.

4. The duty cycle detecting circuit for pulse width modulation of claim 1, wherein the sampling circuit comprises a flip-flop.

5. The duty cycle detecting circuit for pulse width modulation of claim 4, wherein the calculation circuit comprises a counter for receiving the sampling signal and accumulating signal samples in a high electric potential states and signal samples in a low electric potential state respectively.

6. The duty cycle detecting circuit for pulse width modulation of claim 5, wherein the calculation circuit further comprises a reset circuit for resetting the counter after counting a predetermined number of signal samples, so that the counter restarts accumulating signal samples in high electric potential states and signal samples in low electric potential states again.

7. The duty cycle detecting circuit for pulse width modulation of claim 5, wherein the calculation circuit further comprises a divider for dividing a number of signal samples in high electric potential states by a sum of a number of signal samples in high electric potential states and a number of signal samples in low electric potential states to obtain the duty cycle.

8. The duty cycle detecting circuit for pulse width modulation of claim 7, wherein the calculation circuit further comprises a reset circuit for resetting the counter after counting a predetermined number of signal samples, so that the counter restarts accumulating signal samples in high electric potential states and signal samples in low electric potential states again.

9. The duty cycle detecting circuit for pulse width modulation of claim 4, wherein the calculation circuit further includes a counter for receiving the sampling signal and accumulating signal samples in a high electric potential states and total signal samples respectively.

10. The duty cycle detecting circuit for pulse width modulation of claim 9, wherein the calculation circuit further comprises a reset circuit for resetting the counter after counting a predetermined number of signal samples, so that the counter restarts accumulating signal samples in high electric potential states and total signal samples again.

11. The duty cycle detecting circuit for pulse width modulation of claim 9, wherein the calculation circuit further comprises a divider for dividing a number of signal samples in high electric potential states by a total number of signal samples to obtain the duty cycle.

12. The duty cycle detecting circuit for pulse width modulation of claim 11, wherein the calculation circuit further comprises a reset circuit for resetting the counter after counting a predetermined number of signal samples, so that the counter restarts accumulating signal samples in high electric potential states and total signal samples again.

* * * * *